United States Patent [19]

Hatzakis

[11] 4,035,522
[45] July 12, 1977

[54] X-RAY LITHOGRAPHY MASK

[75] Inventor: Michael Hatzakis, Ossining, N.Y.

[73] Assignee: International Business Machines Corporation, Armonk, N.Y.

[21] Appl. No.: 674,191

[22] Filed: Apr. 6, 1976

Related U.S. Application Data

[63] Continuation of Ser. No. 489,853, July 19, 1974, abandoned.

[51] Int. Cl.² .......................................... B05D 3/06
[52] U.S. Cl. .................................. 427/43; 427/44; 427/160; 96/27 E; 96/35

[58] Field of Search ...................... 427/43, 44, 160; 96/27 E

[56] References Cited

U.S. PATENT DOCUMENTS

| 3,462,762 | 8/1969 | Kaspaul et al. | 117/212 |
|---|---|---|---|
| 3,607,382 | 9/1971 | Henker | 117/212 |
| 3,743,842 | 7/1973 | Smith et al. | 280/320 |

Primary Examiner—John D. Welsh
Attorney, Agent, or Firm—Graham S. Jones, II

[57] ABSTRACT

An X-ray mask for variable resist exposure for use with X-ray lithography so that multi-level devices, using a single exposure of X-rays, can be made.

5 Claims, 7 Drawing Figures

X-RAY LITHOGRAPHY MASK

This is a continuation of application Ser. No. 489,853 filed July 19, 1974 now abandoned.

BACKGROUND OF THE INVENTION

In a prior invention by applicant set forth in U.S. Pat. No. 3,649,393, which issued on Mar. 14, 1972 on an application filed June 12, 1970, and assigned to the same assignee as the instant application, a method is set forth for etching a thin metal film on an oxide which is not uniformly thick. Such thin film, which may be self-supporting or supported on a substrate, has markedly different thicknesses in different areas to be etched. A photoresist is placed over the surface of this film of non-uniform thickness and the photoresist covered, variably thick, film is placed in an evacuated chamber that houses an electron beam apparatus. The photoresist is exposed by an electron beam in a series of separate exposures with different exposure densities. The thickest area is exposed first with the highest exposure density. Subsequent exposures are made in the other desired areas with decreasing densities in accordance with decreasing thickness. In the developement steps, the photoresist is developed until the area of highest exposed density is opened and the thin film is etched to the next thickness level. Development is continued until the second highest exposed density is opened and then the thin film is etched to the next film level. Such steps are repeated for each succeeding film thickness until the minimum film thickness is uncovered.

X-rays are now desirable for lithographic fabrication because X-rays allow planar gold patterns on thin silicon substrates to be projected deep into resist material without significant absorption or spreading due to scattering or diffraction. Upon chemical development, one obtains large groove depth to period ratios which are necessary for high efficiency. Such advantageous uses of X-rays for lithography are discussed in greater detail in an article entitles "X-ray Lithography: Complementary Technique to Electron Beam Lithography", by H. I. Smith et al., Twelfth Symposium on Electron, Ion, Laser Beam Technology, MIT, Cambridge, Mass., May 21-23, 1973.

In my prior patent U.S. Pat. No. 3,649,393, a stepped oxide or stepped metal layer (layer 12 in such issued U.S. Pat. No. 3,649,393) results from certain needed fabrication steps employed in the manufacture of semiconductor chips. Due to previous steps, such as the making of openings in an oxide layer over silicon so as to permit diffusion of ions or the like into the silicon through such openings, such graduated layer results. The small openings are reoxidized to heights that are less than the original oxide layer. When such steps are repeated, one attains regions of different oxide thicknesses. My prior patent teaches etching steps in the fabrication process and as such tends to diminish the chances of obtaining high device resolution. In general, one would like the spacing between thick regions to be equal to or less than the height of the thick regions. But due to the undercutting that results when etching is employed, such spacing is greater than the height of a region between spacings and is often about twice that of the height.

GENERAL DESCRIPTION OF THE INVENTION

In the instant case, I use the variable depth etching feature of U.S. Pat. No. 3,649,393 as an incidental procedure towards the making of an X-ray mask. A major reason for using an X-ray mask is to obtain high resolution structures (in the sub-micron range). The mask is built upon a substrate through a resist layer in such a manner that the line width can be less than the thickness of the height or elevated portions of the mask, a condition not obtainable when etching is used. By employing an electron-sensitive resist on a metal substrate, whereby the resist is applied at a thickness that is greater than the intended minimum line width of the mask to be subsequently fabricated by film deposition, rather than by etching, one can make a mask suitable for X-ray lithography.

Figure 1:
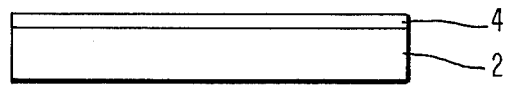
FIGS. 1–7 illustrate the sequential steps needed to carry out the invention. One begins as seen in FIG. 1, with a substrate 2 of any material onto which a metal layer 4, approximately 200 to 300A thick, is deposited. The metal 4 could be gold, copper, permalloy, or any other metal to which another metal can be permanently affixed to by electroplating or electroless deposition. Such thin layer 4 is, like the substrate 2, very transparent to X-rays.
Figure 2:
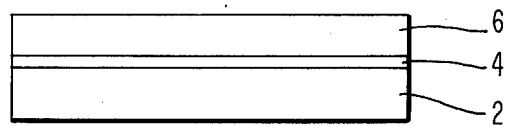

The next step in the fabrication process is shown in FIG. 2 where an electron-sensitive resist (or electron-resist as it is also called) layer 6 is deposited over metal layer 4. The electron-resist is deposited to a thickness that is greater than the intended minimum line width of the subsequently completed mask. For use of X-rays having wavelengths between 2 to 10 angstroms, an electron-resist layer of 2000A-1 micron is adequate. A suitable electron-resist material is poly-(methyl metacrylate) or PMMA and it is a resist that is sensitive to electrons so that after exposure to such electrons the PMMA can be developed by an appropriate solvent.

Figure 3:
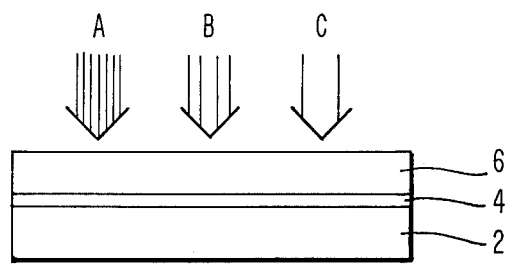
Figure 4:
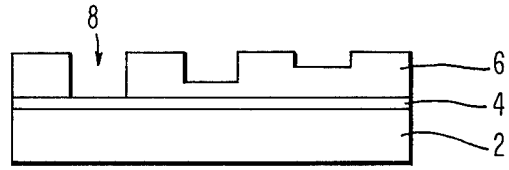

In step 3, as seen in FIG. 3, the resist is exposed at selected areas, to different exposure densities A, B and C. It is assumed that exposure density A > exposure density B and exposure density B > exposure density C. Such exposure densities are computer controlled. A computer is programmed to control the motion of a writing beam so as to determine the length of time the beam dwells on a selected area. A longer dwelling time of a writing beam in the resist 6 will result in a greater exposure density for that area.

Figure 5:
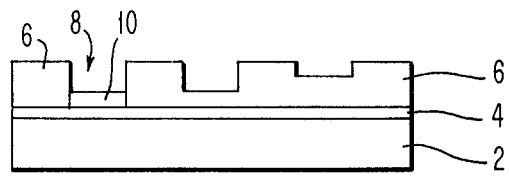
Figure 6:
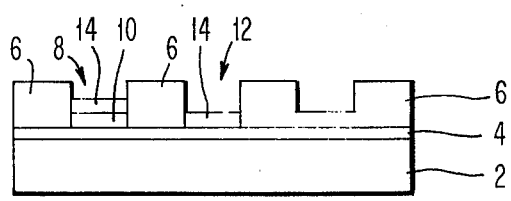

After the differential exposure density of FIG. 3 has taken place, the exposed resist 6 is developed until the most exposed area (under beam A) is opened at region 8 whereas the regions beneath beams B and C still retain electron-resist material. Next, as seen in FIG. 5, gold or other X-ray absorbing material 10 is deposited to a predetermined height into opening 8 onto exposed metal layer 4. Developing of the remaining resist of FIG. 5 continues until the region that was under beam B is opened to become opening 12, but leaving the region of resist 6 that was under beam C still unopened. Again, a predetermined amount of metal is deposited into the two openings so that metal 10 is built up by layer 14 that was deposited in opening 12 of resist 6, as seen in FIG. 6. The final development takes place so that the region under beam C becomes opened. Again a predetermined amount of gold is built up as layer 16. Consequently three differing thicknesses of gold or other material are obtained that are permanently adherent to metal layer 2. The completed mask M, with all the resist 6 now removed, has varying thicknesses along its length and can have more than three variations, depending upon the initial thickness of the electron-resist 6, the sensitivity of that resist to minute variations in exposure densities, and the ability of the computer to generate such minute variations on command.

Figure 7:
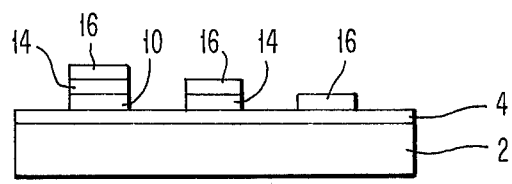

The method for making an X-ray mask (see FIG. 7) shown and described hereinabove is particularly effective because the mask M can be made by a single exposure in an evacuated chamber. If one has to build up the varying thicknesses of gold in incremental steps, the registration problems encountered would be enormous. Such registration of mask openings needed when making a mask of separate exposures would require higher accuracy than the very accuracy you are seeking in the final mask, per se. It should be obvious that different thicknesses of metals can be chosen depending upon the materials used as X-ray absorbers and the maximum attenuation of such X-rays by the substrate 2 and adherent layer 4 that can be tolerated in order to make the completed X-ray mask effective as a differential X-ray absorber.

I claim:

1. In a method for making a mask of varying thickness for use with X-ray lithography to provide multilevel devices using a single exposure of X-rays comprising the steps of:
   a. depositing a thin metal layer on the surface of a substrate, said layer and said substrate both being highly transparent to X-rays,
   b. adherently applying a uniformly thick layer of electron-sensitive resist on the surface of said thin metal layer,
   c. exposing an electron beam on preselected regions of said resist, in a single exposure step to a plurality of different selected areas of exposure having predetermined variable lengths of time the electron beam dwells on a selected area yielding variable densities of exposure to said electron beam,
   d. developing all such exposed regions for the same time period until only the region of resist having had the greatest density of exposure is completely removed to provide a first opened region exposing a first portion of said surface of said thin metal layer but the other exposed regions of resist are only partially removed according to their densities of exposure, leaving the surface of said thin metal layer thereunder covered,
   e. depositing a first layer of X-ray absorbing material into said first opened region onto said first portion and not where said resist remains,
   f. developing said resist again until that region of said resist having had the second greatest density of exposure is removed to provide a second opening region exposing a second portion of said surface of said thin metal layer, but the other exposed regions of resist that have had a lesser density of exposure remain partially, leaving the portions of said thin metal layer thereunder covered by resist,
   g. depositing a second layer of X-ray absorbing material into both said first and second opened regions onto said first and second portions to add an equal thickness of material on both said portions yielding a greater thickness of X-ray absorbing material on said first portion than on said second portion, and
   h. repeating steps (d) and (e) in consecutive order until all exposed resist regions are opened and a mask is produced that includes deposits of X-ray absorbing material of varying thickness on each of said portions and is accordingly differentially absorbent of an X-ray beam at said different regions of said mask.

2. The method of claim 1 wherein said layer of electron-resist is of the order of 2000A-1 micron thick.

3. The method of claim 2 wherein said electron-resist is poly-(methy methacrylate).

4. The method of claim 1 wherein the thickness of said electron-resist is greater than or equal to the minimum line width of said fabricated mask.

5. The method of claim 1 wherein said thin layer of metal that is transparent to X-rays is one that is capable of being permanently adherent to the X-ray absorbing material being deposited therein.

* * * * *